| United States Patent [19] | [11] Patent Number: 4,885,053 |
|---|---|
| Bogenschütz et al. | [45] Date of Patent: Dec. 5, 1989 |

[54] PROCESS FOR METAL-PLATING AN ELECTRICALLY POORLY CONDUCTING SUBSTRATE MADE OF AN INORGANIC MATERIAL

[75] Inventors: August F. Bogenschütz, Oberdischingen; Josef L. Jostan; Robert Ostwald, both of Ulm, all of Fed. Rep. of Germany

[73] Assignee: Licentia Patent-Verwaltungs-GmbH, Frankfurt am Main, Fed. Rep. of Germany

[21] Appl. No.: 885,251

[22] Filed: Jul. 7, 1986

[30] Foreign Application Priority Data

Jul. 4, 1985 [DE] Fed. Rep. of Germany ....... 3523960

[51] Int. Cl.$^4$ .............................................. C03C 15/00
[52] U.S. Cl. ...................................... 156/635; 156/645; 156/662; 156/663
[58] Field of Search ............... 156/626, 662, 635, 646, 156/663, 645, 651; 427/309; 65/31

[56]         References Cited
         U.S. PATENT DOCUMENTS

| 3,963,338 | 6/1976 | Altman | 156/635 |
| 4,063,991 | 12/1977 | Farrall et al. | 156/645 |
| 4,265,942 | 5/1981 | Feldstein | 427/306 |
| 4,309,454 | 1/1982 | Feldstein | 427/306 |
| 4,416,725 | 11/1983 | Cuomo et al. | 156/635 |
| 4,477,309 | 10/1984 | Chudy et al. | 156/635 |
| 4,647,477 | 3/1987 | DeLuca | 156/667 |
| 4,690,727 | 9/1987 | Scott et al. | 156/635 |

FOREIGN PATENT DOCUMENTS

| 2116376 | 7/1972 | European Pat. Off. | |
| 0034548 | 10/1971 | Japan | 156/635 |
| 0167446 | 10/1983 | Japan | 156/635 |
| 0167447 | 10/1983 | Japan | 156/635 |

OTHER PUBLICATIONS

Chem Abs. 89(6):52379n Bassou et al.

Primary Examiner—David L. Lacey
Assistant Examiner—L. Johnson
Attorney, Agent, or Firm—Spencer & Frank

[57] ABSTRACT

A process for etching at least a portion of a surface of a ceramic substrate preparatory to metal-plating thereof, the process including, applying to the surface of the ceramic substrate a substantially uniform coating of a chemical precursor of an alkaline etching substance; and treating the chemical precursor to chemically transform it into the alkaline etching substance and etch the surface. Preferably the at least one chemical precursor is an organic alkali compound or an organic alkaline earth compound.

4 Claims, No Drawings

PROCESS FOR METAL-PLATING AN ELECTRICALLY POORLY CONDUCTING SUBSTRATE MADE OF AN INORGANIC MATERIAL

FIELD OF THE INVENTION

The present invention relates to a method for metal-plating an electrically poor conducting substrate made of an inorganic material. More specifically, this invention relates to an improved method for metal-plating ceramic substrates.

BACKGROUND OF THE INVENTION

An important step in metal-plating ceramic and ceramic-like substrates is the prior disruption of the substrate's surface in order to clean soiled surfaces and to produce positive roughening by means of special etching media. Only in this way can good adhesion to the substrate of the subsequently applied metal layer, be attained. Such adhesion is partly based on mechanical anchoring and partly on chemical bonding to the surface.

In some cases, such as the production of so-called printed circuits on ceramic substrates, it is necessary for metal-plating to be effected with electrical characteristics which lie within close limits of tolerance. To achieve this, it is particularly important that there always exist an essentially uniform interface layer between the substrate and the metal layer applied thereto. Such an interface layer influences, for example, the so-called electric loss angle of an electrical circuit arrangement.

Thus, there is still a need for an improved process of this type, whereby metal-plating may be accomplished in a reproducible manner with precisely predetermined characteristics, preferably in a cost effective and reliable manner which is easily adaptable to industrial mass production.

SUMMARY OF THE INVENTION

The present invention provides an improved process for metal-plating a ceramic substrate, the improvement wherein prior to metal deposition the following steps are performed a first step comprising applying to the surface of the substrate a coating comprising an etching substance or a precursor thereof; and a second step comprising allowing for the coating surface to be etched by said substance or precursor.

DESCRIPTION OF THE INVENTION

It is possible to produce a surface having a given degree of roughness, known as roughness depth, on a substrate made of commercially available ceramic materials such as $Al_2O_3$. This is done by careful selection of an etching medium. The etching medium can be tailored to the material of the substrate and produced by a combination of a step with a pretreatment medium, and a subsequent treatment with a surface-disrupting medium adapted thereto.

It is possible to vary the period of contact of the etching medium with the substrate. In addition thereto, it is possible to fine tune the etching attack on the surface by selecting a method of applying the pretreatment medium and the surface disrupting medium during the subsequent treatment.

An immersion method is generally preferred in the case of a pretreatment agent comprising a melt containing NaOH or KOH. This mehtod operates with constant regulatable substrate immersion and extraction speeds. In such cases, the surfaces can also be coated with powders, for example according to the so-called "breading" method in which the workpiece is moistened and then dipped into a powder which sticks thereto and then melting the powder on the substrate.

With saturated solutions of aqueous alkali, however, a horizontally operating spray process is preferred. In cases where the solutions are highly viscous, foam etching on an oblique plane is also possible.

A particularly easily controllable process is gas phase etching, whereby the substrate is preferably introduced into the vapor of an alkali reacting medium. In this process, it is possible to monitor the progress of surface decomposition throughout the reaction period and to interrupt the process as desired.

An arrangement involving a simple apparatus is the centrifugal surface disruption process which is primarily used with aqueous solutions. Printing of alkali pastes is also of advantage depending on the type and size of the ceramic substrate subjected to the pretreatment. Both planar or partial printing in the manner of screen printing is possible by this method.

A further advantage of the present invention is that reproducible positively-graduated etchings can be attained which can be individually tailored to the quality of the ceramic material to be metal-plated and to each particular application. This is preferably accomplished by choosing the substances applied to the ceramic surface which in turn are made to react during a subsequent thermal or hydrothermal treatment applied to the coated ceramic substrate. The subsequent treatment can result in the thermal decomposition of the applied compounds or in the hydrolysis thereof into its components, thereby diluting or increasing the concentration of the effective substance. This effect is then utilized to control the surface etching process.

One etch-effective substance in the case of an $Al_2O_3$ ceramic is a strong base. This base may be produced, e.g., by hydrolysis of sodium amide represented by the following reaction equation

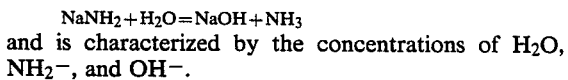

and is characterized by the concentrations of $H_2O$, $NH_2^-$, and $OH^-$.

In one aspect of this invention, it was found that the etching intensity of a strong base, such as sodium hydroxide can be predetermined over a wide range in accordance with the above reaction products, or by activation with certain additives as a function of the type of formation reaction as well as concentration, the displacement of the chemical equilibrium thereof or its dilution.

The invention will now be explained with reference to the following examples, which are included for illustrative purposes only, and are not meant to limit the scope of the invention or the claims.

EXAMPLES

Example 1

Small aluminum oxide ceramic plates (99.5% $Al_2O_3$, $0.6 \times 50.8 \times 50.8$ mm$^3$) are immersed for 10 minutes in a melt of sodium amide at 250° C. After extraction, the plates are suspended, still in the hot state, for 5 minutes above a vessel containing boiling water. The plates are then tempered for 12 minutes in a tubular furnace in an atmosphere free of carbon dioxide at a temperature of 300° C. After cooling and thorough rinsing in water, the ceramic samples are covered with catalytic nuclei according to the known tin salt/palladium salt process and are provided with a basic copper layer of about 0.2 μm in a currentless chemical manner from a presently commercially available chemical copper bath. After intermediate rinsing, more copper is applied from a presently commercially available galvanic copper sulfate bath until the copper layer has a thickness of about 12 μm. To test adhesion, strips of a width of 1 mm are produced by photoetching and the force required to vertically peel away these strips is measured in a tensile strength measuring machine. The measured peel strengths are about 0.8 N/mm.

Example 2

Small ceramic plates made of $Al_2O_3$ are dipped for 10 minutes in a melt of sodium formate having a temperature of 290° C. in a fume hood. After extraction from the melt, the samples are tempered at 450° C. for 3 minutes in a tubular furnace under nitrogen atmosphere. Then the samples are permitted to cool in air, are thoroughly rinsed with water and covered with nuclei as in Example 1, are metal-coated chemically in the absence of an external electric current and finally galvanically coated with approximately 12 μm copper. Peel strength measurements of prepared strips produced values of about 0.7 N/mm.

It will be understood the above description of the present invention is susceptible to various modifications, changes and adaptations, and the same are intended to be comprehended within the meaning and range of equivalents of the appended claims.

What is claimed is:

1. A process for etching at least a portion of a surface of a ceramic substrate preparatory to metal-plating thereof, the process comprising:
   (a) applying to at least a portion of a surface of a ceramic substrate a substantially uniform coating comprised of a least one chemical precursor of an alkaline etching substance, which at least one chemical precursor is one of an organic alkali compound or an organic alkaline earth compound; and
   (b) treating the at least one chemical precursor to chemically transform it into the alkaline etching substance; and
   (c) etching said at least a portion of said surface with the alkaline etching substance.

2. The process according to claim 1, wherein the at least one chemical precursor is an alkali amide, and wherein the alkaline etching substance is produced from the alkali amide by hydrolyzing the alkali amide to obtain an alkali hydroxide and ammonia.

3. The process according to claim 1, wherein the at least one chemical precursor is an alkali formate, and wherein the alkaline etching substance is produced from the alkali formate by chemically converting the alkali formate to carbon monoxide and the corresponding alkali hydroxide.

4. The process according to claim 1, wherein the alkaline etching substance is produced in step b by chemical transformation of the at least one chemical precursor by applying one of thermal energy or hydrothermal chemical energy.

* * * * *